United States Patent [19]

Flohrs

[11] Patent Number: 4,564,771
[45] Date of Patent: Jan. 14, 1986

[54] INTEGRATED DARLINGTON TRANSISTOR COMBINATION INCLUDING AUXILIARY TRANSISTOR AND ZENER DIODE

[75] Inventor: Peter Flohrs, Reutlingen, Fed. Rep. of Germany

[73] Assignee: Robert Bosch GmbH, Stuttgart, Fed. Rep. of Germany

[21] Appl. No.: 511,154

[22] Filed: Jul. 6, 1983

[30] Foreign Application Priority Data

Jul. 17, 1982 [DE] Fed. Rep. of Germany ....... 3226850

[51] Int. Cl.⁴ ............................................. H03K 17/60
[52] U.S. Cl. ................................... 307/315; 307/270; 307/303; 307/310; 307/318; 307/254
[58] Field of Search ............... 307/549, 570, 254, 270, 307/285, 303, 310, 315, 318

[56] References Cited

U.S. PATENT DOCUMENTS

| 3,577,062 | 5/1971 | Hoffman | 307/285 X |
|---|---|---|---|
| 3,577,167 | 5/1971 | Avins | 307/315 X |
| 3,633,052 | 1/1972 | Hanna | 307/285 X |
| 3,997,802 | 12/1976 | Hoehn | 307/303 X |
| 4,028,561 | 6/1977 | Black et al. | 307/254 X |
| 4,259,939 | 4/1981 | Coates | 307/303 X |
| 4,369,380 | 1/1983 | Menniti et al. | 307/254 |

FOREIGN PATENT DOCUMENTS

WO82/00045 3/1982 PCT Int'l Appl. ................ 307/315

*Primary Examiner*—Stanley D. Miller
*Assistant Examiner*—D. R. Hudspeth
*Attorney, Agent, or Firm*—Frishauf, Holtz, Goodman & Woodward

[57] ABSTRACT

In a three-stage Darlington transistor circuit, the base of the middle transistor is connected to the series combination of a resistance and a Zener diode, with the Zener diode anode being connected to the resistance. A voltage divider is provided between the collector and emitter of the power transistor. For reducing the loading and deviation from nominal value of the voltage divider with change of temperature, an auxiliary transistor ($T_4$) is provided having its base connected to one tap of the voltage divider and its emitter to the cathode of the Zener diode. The collector of the auxiliary transistor is provided in the integrated circuit substrate in common with the collectors of the transistors of the Darlington circuit. The other tap of the voltage divider is provided for emitter-collector clamping voltage purposes.

12 Claims, 4 Drawing Figures

INTEGRATED DARLINGTON TRANSISTOR COMBINATION INCLUDING AUXILIARY TRANSISTOR AND ZENER DIODE

This invention concerns a Darlington transistor combination incorporating a power transistor, a driver transistor and an input transistor with their respective collectors connected together, of the kind in which a circuit branch containing in series a first resistance and a Zener diode having its anode connected to that resistance, is connected to the base of the driver transistor and the cathode of the Zener diode is connected to a voltage divider which in turn is connected across the collector-emitter path of the power transistor of the Darlington combination, these components and other components which are conventional in Darlington circuits being incorporated in an integrated circuit unit.

A Darlington transistor circuit of this general kind is disclosed in PCT International Patent Application PCT/DE 82/00045, to which corresponds U.S. patent application Ser. No. 464,503, filed Jan. 27, 1983, the contents of which are herein incorporated by reference.

By the provision of the Zener diode, its series resistance and the base to emitter resistor of the driver transmitter, the effect is obtained in this circuit that when a certain voltage is reached at the cathode of the Zener diode, the driver transistor and the power transistor are switched in and that by appropriately setting the resistance ratio of the resistors just mentioned, the temperature dependence of this switch-in voltage can be suitably set. By supplementary provision of the voltage divider comprising third and fourth resistors, the further result is obtained that the switch-in voltage is upwardly transformed by the voltage division ratio of this voltage divider to provide a collector-emitter limiting voltage, sometimes referred to as a clamping effect.

Another resistor of a value in the range of a few ohms is provided in parallel to the emitter-base path of the power transistor in the circuit of the disclosure just mentioned. This leads to a shortening of the switching time and to a better energy distribution in operation in clamped condition.

The above-described known Darlington transistor circuit has the disadvantage, however, that the loading of the voltage divider composed of resistors and also its deviation from nominal value are strongly dependent upon temperature.

SUMMARY OF THE INVENTION

It is an object of the present invention to provide an integrated Darlington transistor combination of characteristics less dependent upon temperature than those heretofore available and in particular less dependent upon temperature than the Darlington circuit combination of the above-identified known type.

Briefly, an integrated auxiliary transistor is provided on the common substrate of the Darlington combination and interposed between the tap of the voltage divider and the cathode of the Zener diode, with its emitter connected to the cathode of the Zener diode, its base to the tap of the voltage divider and its collector provided by the common substrate.

The Darlington transistor combination of the present invention has the advantage that the loading and also the deviation from nominal characteristics of the voltage divider with changes of temperature are reduced. The auxiliary transistor requires only little chip surface.

The voltage divider can have its resistances either provided in the substrate of which furnishes the collector zones of the various transistors or provided externally to the integrated circuit.

The particular advantage of the Darlington transistor combination of the invention is that the monolithically integrated part can be produced by a costeffective simple planar process in which the integrated circuit elements are diffused into a common collector substrate, while the special and costly features characteristic of normal bipolar integrated circuit technology, such as epitaxy, isolation diffusion, conducting layers and the like are avoided.

BRIEF DESCRIPTION OF THE DRAWINGS

The invention is described in more detail by way of an illustrative example of the kind in which the voltage divider consisting of the third and fourth resistors are monolithically integrated with the rest of the circuit, with reference to the annexed drawings, in which.

DESCRIPTION OF THE PREFERRED EMBODIMENT

Figure 1:
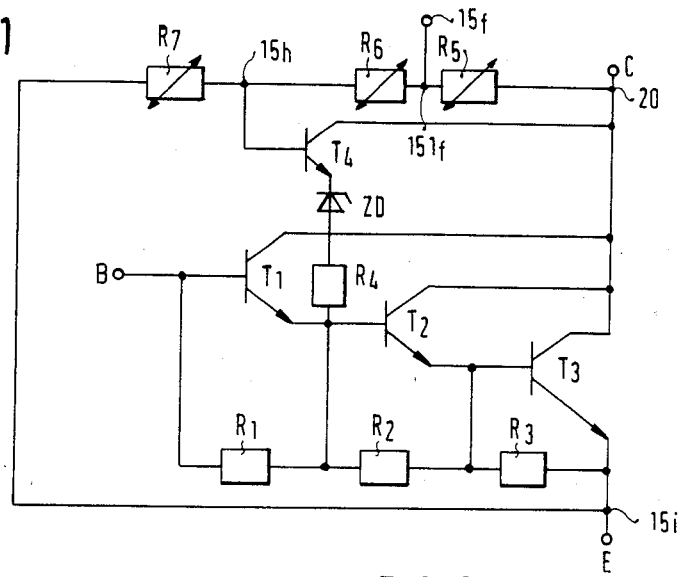
FIG. 1 is the electrical circuit of a monolithically integrated Darlington transistor combination embodiment of the invention.

FIG. 1 shows a three-stage Darlington transistor including a power transistor $T_3$, a driver transistor $T_2$ and an input transistor $T_1$. The collectors of these transistors $T_1,T_2,T_3$ are connected together, while the emitter of the driver transistor $T_2$ is connected to the base of the power transistor $T_3$ and the emitter of the input transistor $T_1$ to the base of the driver transistor $T_2$. The base B of the input transistor $T_1$ is controllable by an input signal. The emitter-base paths of the transistors $T_1,T_2,T_3$ are respectively bridged by resistances $R_1,R_2,R_3$. There is connected to the base of the driver transistor $T_2$ a series circuit composed of a resistance $R_4$ and a Zener diode ZD having its anode connected to the resistance $R_4$. Between the collector C and the emitter E of the power transistor $T_3$, there is a voltage divider composed of the series circuit of the resistances $R_5,R_6,R_7$ and providing two taps 15$f$ and 15$h$.

According to the invention, in auxiliary transistor $T_4$ is provided having its base connected to the tap 15$h$ lying between the resistances $R_6$ and $R_7$ and its emitter at the cathode of the Zener diode ZD. The collector of this auxiliary transistor is connected to the collectors of the transistors $T_1,T_2,T_3$ which, as is usual in a Darlington circuit, are connected together.

As is further shown in FIG. 1, the resistances $R_5,R_6$ and $R_7$ are constituted as variable resistors.

If as further described below the entire circuit of FIG. 1 is integrated monolithically, the resistances $R_5,R_6$ and $R_7$ then constitute a calibratable voltage divider on the semiconductor wafer surface. During the trimming or calibration operation, the desired emitter-collector clamping voltages are set, at which the Zener diode ZD breaks down and the transistors $T_2$ and $T_3$ are turned on, so that the power transistor $T_3$ cannot suffer damage from energy-rich voltage peaks in the $U_{CEO}$-breakdown. The temperature course of the clamping voltage can be set by the resistance $R_4$ which is to be electrically dimensioned, particularly in proportion to resistance $R_2$. It is generally desired to bring the temperature effect practically to the vanishing point. The small auxiliary transistor $T_4$, which can be integrated into the integrated circuit, serves to reduce the loading and also the deviation from nominal value, of the voltage divider $R_5, R_6, R_7$ with changes of temperature.

The base zones of the transistors $T_1$ to $T_4$, lying on the surface beneath a silicon dioxide layer, are protected, as described below with reference to FIGS. 2 to 4 by a metal electrode 15f applied, in general, simultaneously with the base and emitter metallization. This electrode 15f is connected to a tap of the voltage divider $R_5, R_6, R_7$. As a rule, it is necessary for that voltage divider to have a voltage division ratio different than that for the emittercollector clamping by means of the Zener diode, so that a single tap of the voltage divider is not sufficient. In principle, it is possible, in a combination in accordance with the invention, for a base-collector breakdown voltage determined by the potential of the covering electrode 15f to be set separately from the emitter-collector clamping voltage if at least two of the resistances $R_5, R_6$ and $R_7$ are trimmable. If the maximum base-collector breakdown voltage lies distinctly above the desired emitter-collector clamping voltage, however, a separate trimming can be dispensed with if it is assured by the manufacturing tolerances of the resistances and of the Zener voltage that after trimming of one of the resistances $R_5, R_6$ or $R_7$, the base-collector breakdown voltage determined by the cover electrode will lie above the emitter-collector clamping voltage.

Figure 2:
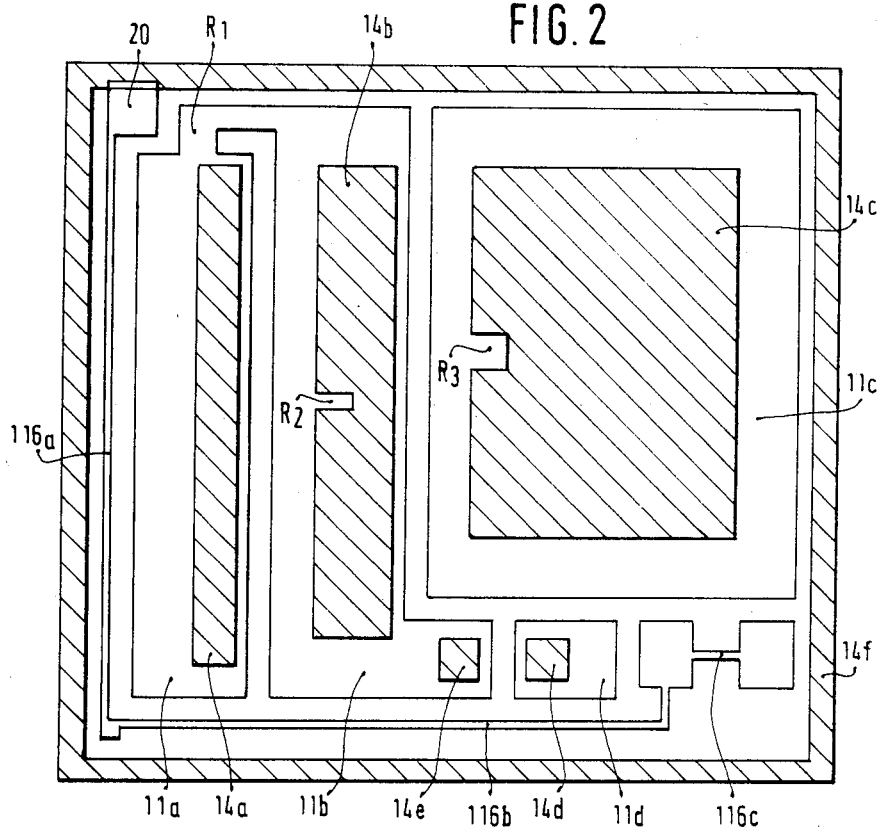
FIGS. 2 and 3 are schematic layouts of a preferred embodiment of the circuit of FIG. 1.
Figure 3:
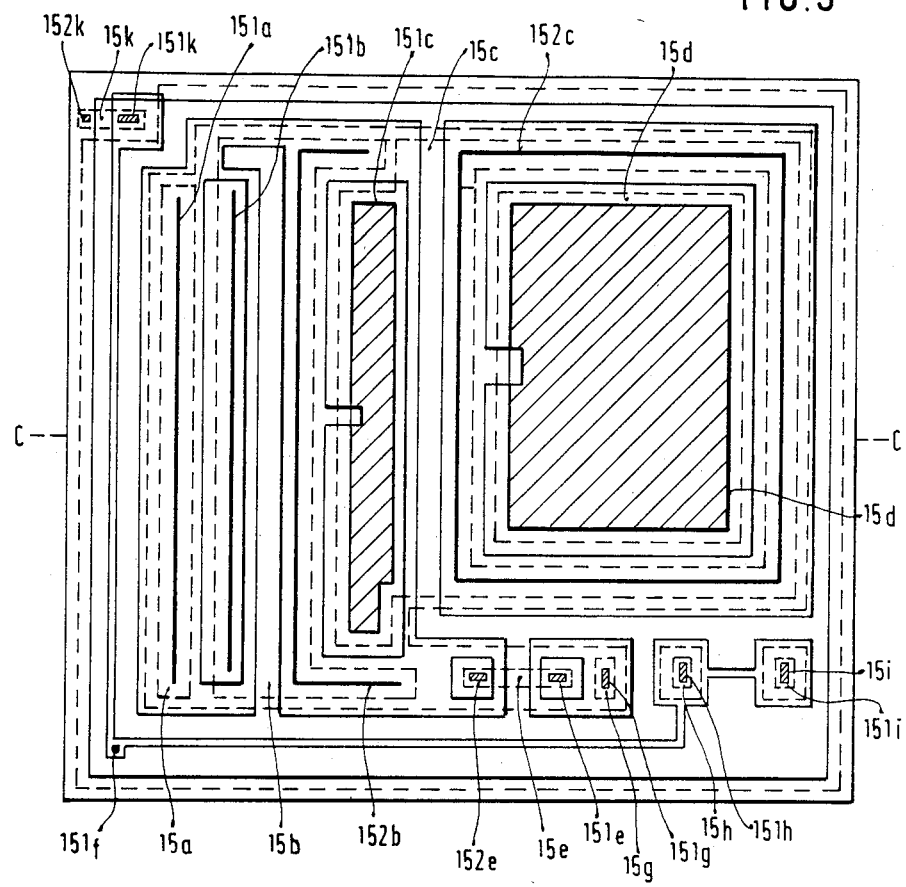
Figure 4:
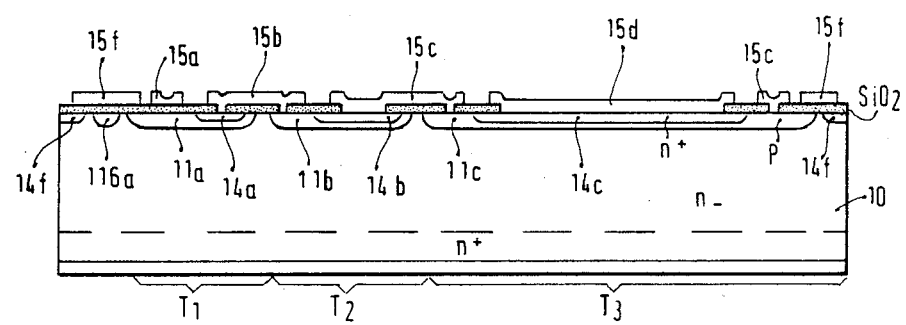
FIG. 4 is a section of the embodiment shown in FIG. 3 along the line C—C of FIG. 3.

FIGS. 2 and 3 show schematically an embodiment of the circuit shown in FIG. 1, while FIG. 4 shows a section along the line C—C of FIG. 3.

FIG. 2 shows the semiconductor layout after the prelayering and driving in of the $p^-$ and $n^+$ regions ($n^+$ regions diagonally shaded). The zones 11a, 11b, 11c and 11d represent the base regions of the transistors $T_1, T_2, T_3$ and $T_4$. The narrow p conductivity strips 116a, 116b and 116c form the resistances $R_5, R_6$ and $R_7$. The dispositions for trimming are not shown in FIGS. 2 and 3 in order to improve the clarity of the diagram. The zones 14a, 14b, 14c and 14d form the emitter regions of the transistors $T_1, T_2, T_3$ and $T_4$. The zone 14e forms, together with the zone 11b, the Zener diode ZD, while the base-path resistance of the lower right off-shoot of the base zone 11b of the transistor $T_2$ forms the resistance $R_4$.

FIG. 3 shows the same layout as FIG. 2, but after the opening of the contact windows close diagonal shading and after the application of the metallization (outlined in broken lines). The metal region 15a is connected in the contact window 151a to the base zone 11a of the transistor $T_1$. The metal region 15b connects together the zones 14a and 11b through the contact windows 151b and 152b respectively, while the metal region 15c likewise connects together the zones 14b and 11c through the contact windows 151c and 152c. The metal region 15d is connected through the contact window 151d to the emitter zone 14c of the transistor $T_3$. The metal region 15e connects the $n^+$ conductivity emitter zone 14d of the transistor $T_4$ with the $n^+$ conductivity cathode 14e of the Zener diode ZD through the contact windows 151e and 152e. The metal region 15f represents a cover electrode which is connected to the junction 151f of the voltage divider 116a, 116b, 116c corresponding to the voltage divider $R_5, R_6, R_7$ of FIG. 1.

The metal strip 15k connects the collector side end 20 of the voltage divider 116a, 116b, 116c with the $n^+$ region 14f lying essentially at collector potential, this being done through the contact windows 151k and 152k. The metallization region 15g (base of transistor $T_4$) and 15h (tap of voltage divider 116a, 116b, 116c) on the one hand, and the metallization region 115i (emitter side end of the voltage divider) and 15d (emitter metallization of transistor $T_3$) on the other hand are actually to be connected. The illustration proceeds on the basis that these connections will be short-circuited by measuring probes during pre-measurement of the wafer by automatic equipment for purposes of trimming the voltage divider and that the ultimate connection will be performed after the soldering of the chips, by wire bonding. This procedure has the advantage that the blocking characteristics of the transistors can be checked without leakage current of the voltage dividers. Of course, the metallic connections can also be produced earlier along with the other metallization, in which case, as is evident to those familiar with the art, the cover electrode 15f must have cutouts and the metallization 15c and window 152c must be interrupted.

The invention is not limited to the particular embodiment described with reference to FIGS. 1 to 4. In particular, it is also possible to provide the voltage divider consisting of the resistances $R_5, R_6$ and $R_7$ or 116a, 116b and 116c externally in a separate component, either discrete or monolithically integrated, instead of providing this voltage divider in the substrate 10 which contains the transistors $T_1, T_2, T_3$ and $T_4$. It is accordingly evident that although the invention has been disclosed with reference to a particular illustrative example, variations and modifications are possible within the inventive concept.

I claim:

1. Darlington transistor combination comprising an input transistor ($T_1$), a driver transistor ($T_2$) and a power transistor ($T_3$), the respective collectors of said input and driver transistor being connected to the collector of said power transistor, the emitter of said input transistor being connected to the base of said driver transistor and the emitter of said driver transistor being connected to the base of said power transistor, the base of said input transistor being the control electrode of said transistor combination for connection of an input signal, and the collector and emitter of said power transistor providing the controlled path connection of said transistor combination, the base of said driver transistor ($T_2$) being connected to a series circuit containing a first resistance ($R_4$) connected to said driver transistor base and a Zener diode (ZD) having its anode connected to said first resistance ($R_4$), a second resistance ($R_2$) being connected in parallel to the base-emitter path of said driver transistor, said transistors, Zener diode, and first and second resistances being constituted as portions of an integrated circuit monolithically integrated by planar integrated circuit technology on a common semiconductor substrate which provides the collector zones of said transistors, the cathode of said Zener diode (ZD) being in circuit with the tap (15h) of a voltage divider consisting of a third resistance ($R_5, R_6$) and a fourth resistance ($R_7$), said voltage divider having its ends respectively connected to the collector and emitter of said power transistor ($T_3$), said transistor combination incorporating the improvement which comprises:

an auxiliary transistor ($T_4$) monolithically integrated on said common substrate and having its collector zone provided by said common substrate, coupled for conduction of the series circuit between said base of said driver transistor (T$_2$) and the cathode of said Zener diode (ZD) under control of the potential of said tap (15h) of said voltage divider and having its collector connected to the collector of said power transistor by virtue of its said collector, like the collectors of the others of said transistors (T$_1$, T$_2$, T$_3$), being provided by said common substrate, the base-emitter path of said auxiliary transistor (T$_4$) being connected for receiving current flowing between said tap and said Zener diode cathode.

2. Darlington transistor combination according to claim 1, in which said auxiliary transistor (T$_4$) has its base connected to said tap (15h) of said voltage divider (R$_5$,R$_6$,R$_7$) and its emitter connected to the cathode of said Zener diode (ZD).

3. Darlington transistor combination according to claim 2, in which in addition to said tap (15h) of said voltage divider, said voltage divider is provided with an additional tap (15f) electrically closer to said common collector connection for emitter-collector clamping by means of said Zener diode.

4. Darlington transistor combination according to claim 2, in which all of said resistances, including the resistances of said voltage divider, are monolithically integrated in the same integrated circuit unit as said transistors, and in which said resistances of said voltage divider are integrated monolithically in planar technology in said common substrate providing the collector zones of said transistors.

5. Darlington transistor combination according to claim 3, in which all of said resistances, including the resistances of said voltage divider, are monolithically integrated in the same integrated circuit unit as said transistors, and in which said resistances of said voltage divider are integrated monolithically in planar technology in said common substrate providing the collector zones of said transistors.

6. Darlington transistor combination according to claim 2, in which the resistances of said voltage divider are provided externally of said substrate providing the collector zones of said transistors and are constituted in at least one discrete circuit component.

7. Darlington transistor combination according to claim 3, in which the resistances of said voltage divider are provided externally of said substrate providing the collector zones of said transistors and are constituted in at least one discrete circuit component.

8. Darlington transistor combination according to claim 1, in which in addition to said tap (15h) of said voltage divider, said voltage divider is provided with an additional tap (15f) electrically closer to said common collector connection for emitter-collector clamping by means of said Zener diode.

9. Darlington transistor combination according to claim 1, in which all of said resistances, including the resistances of said voltage divider, are monolithically integrated in the same integrated circuit unit as said transistors, and in which said resistances of said voltage divider are integrated monolithically in planar technology in said common substrate providing the collector zones of said transistors.

10. Darlington transistor combination according to claim 8, in which all of said resistances, including the resistances of said voltage divider, are monolithically integrated in the same integrated circuit unit as said transistors, and in which said resistances of said voltage divider are integrated monolithically in planar technology in said common substrate providing the collector zones of said transistors.

11. Darlington transistor combination according to claim 1, in which the resistances of said voltage divider are provided externally of said substrate providing the collector zones of said transistors and are constituted in at least one discrete circuit component.

12. Darlington transistor combination according to claim 8, in which the resistances of said voltage divider are provided externally of said substrate providing the collector zones of said transistors and are constituted in at least one discrete circuit component.

* * * * *